United States Patent
Park et al.

(10) Patent No.: US 9,608,221 B2
(45) Date of Patent: Mar. 28, 2017

(54) SOLAR CELL HAVING ORGANIC NANOWIRES

(71) Applicant: Samsung Electronics Co., Ltd., Suwon-Si, Gyeonggi-Do (KR)

(72) Inventors: Young-jun Park, Suwon-si (KR); Zhenan Bao, Stanford, CA (US); Joon-hak Oh, Stanford, CA (US)

(73) Assignees: Samsung Electronics Co., Ltd., Gyeonggi-do (KR); The Board of Trustees of the Leland Stanford Junior University, Palo Alto, CA (US)

( * ) Notice: Subject to any disclaimer, the term of this patent is extended or adjusted under 35 U.S.C. 154(b) by 4 days.

(21) Appl. No.: 14/619,910

(22) Filed: Feb. 11, 2015

(65) Prior Publication Data
US 2015/0155508 A1    Jun. 4, 2015

Related U.S. Application Data

(62) Division of application No. 12/656,837, filed on Feb. 17, 2010, now abandoned.

(30) Foreign Application Priority Data

Oct. 15, 2009  (KR) .................. 10-2009-0098412

(51) Int. Cl.
*H01L 51/42* (2006.01)
*H01L 51/44* (2006.01)
*H01L 51/00* (2006.01)

(52) U.S. Cl.
CPC ........ *H01L 51/4253* (2013.01); *H01L 51/441* (2013.01); *H01L 51/0036* (2013.01); *H01L 51/0037* (2013.01); *H01L 51/0038* (2013.01); *H01L 51/0053* (2013.01); *H01L 51/4226* (2013.01); *Y02E 10/549* (2013.01); *Y02P 70/521* (2015.11)

(58) Field of Classification Search
CPC . H01L 51/00; H01L 51/0032; H01L 51/0036; H01L 51/0038
See application file for complete search history.

(56) References Cited

U.S. PATENT DOCUMENTS

2004/0118448 A1\* 6/2004 Scher .................... B82Y 10/00
  136/252
2005/0000565 A1 1/2005 Zeng
(Continued)

FOREIGN PATENT DOCUMENTS

FR    2892563 A1    4/2007
JP    2003-332600 A    11/2003
(Continued)

OTHER PUBLICATIONS

European Search Report dated Sep. 6, 2012; Corresponding to application No. 10166568.5-1235/2312665.
(Continued)

*Primary Examiner* — Christina Chern
(74) *Attorney, Agent, or Firm* — Harness, Dickey & Pierce, P.L.C.

(57) ABSTRACT

Example embodiments relate to a solar cell including organic nanowires. The solar cell may include a photoelectric conversion layer formed of a p-type material including an organic material and an n-type material including organic nanowires.

6 Claims, 6 Drawing Sheets

(56) References Cited

U.S. PATENT DOCUMENTS

| | | |
|---|---|---|
| 2005/0009224 A1 | 1/2005 | Yang et al. |
| 2005/0029610 A1 | 2/2005 | Nishikitani et al. |
| 2006/0257637 A1 | 11/2006 | Pereira et al. |
| 2007/0246094 A1 | 10/2007 | Brabec et al. |
| 2008/0149174 A1 | 6/2008 | Chen et al. |
| 2008/0245413 A1 | 10/2008 | Ruan et al. |
| 2009/0050207 A1 | 2/2009 | Galvin et al. |
| 2009/0107539 A1 | 4/2009 | Musha et al. |
| 2009/0120491 A1 | 5/2009 | Berson et al. |
| 2009/0133750 A1* | 5/2009 | Moon ............ H01L 31/035281 136/256 |
| 2009/0151787 A1 | 6/2009 | Yoshikawa et al. |
| 2009/0165857 A1 | 7/2009 | Naito et al. |
| 2009/0179002 A1 | 7/2009 | Cheng et al. |
| 2009/0236591 A1 | 9/2009 | Konemann et al. |
| 2009/0308458 A1* | 12/2009 | Aramaki ................ B82Y 10/00 136/263 |
| 2010/0147365 A1 | 6/2010 | DeSimone et al. |

FOREIGN PATENT DOCUMENTS

| | | |
|---|---|---|
| JP | 2006049890 A | 2/2006 |
| JP | 2007-258235 A | 10/2007 |
| JP | 2008091575 A | 4/2008 |
| JP | 2009194362 A | 8/2008 |
| JP | 2009-212477 A | 9/2009 |
| KR | 10-0540101 B1 | 1/2006 |
| KR | 10-0734842 B1 | 7/2007 |
| KR | 2007-0089956 A | 9/2007 |
| KR | 2007-0102661 A | 10/2007 |
| KR | 2008-0104181 A | 12/2008 |
| KR | 2009-0033712 A | 4/2009 |
| KR | 2009-0054260 A | 5/2009 |
| WO | WO-03075364 A1 | 9/2003 |
| WO | WO-03/083128 A2 | 10/2003 |

OTHER PUBLICATIONS

A.M.C. NG, et al., "Perylene Tetracarboxylic Diimide (PTCDI) nanowired: Synthesis and Characterisation", Proc. of SPIE, vol. 6321, 2006, pp. 63210N-1-63210N-8.

Tang C W: "Two-Layer Organic Photovoltaic Cell", Applied Physics Letters, vol. 48, No. 2, Jan. 13, 1986, pp. 183-185.

Alejandro L. Briseno et al., "Perylenediimide Nanowires and Their Use in Fabricating Field-Effect Transistors and Complementary Inverters", Nano Letters, vol. 7, No. 9, Aug. 16, 2007, pp. 2847-2853.

Chang M Y et al., "Polymer solar cells incorporating one-dimensional polyaniline nanotubes", Organic Electronics, vol. 9, No. 6, available online Aug. 6, 2008, pp. 1136-1139.

Yang Fan et al.: "Morphology control and material mixing by high-temperature organic vapor-phase deposition and its application to thin-film solar cells", Journal of Applied Physics, vol. 98, No. 1, Jul. 8, 2005, pp. 14906-1 to 14906-10.

Japanese Office Action issued for corresponding Japanese application No. JP2010-227543 on May 27, 2014.

Japanese Office Action issued for corresponding Japanese application No. 2010-022754 on Feb. 3, 2014 and its English translation.

Liu et al.; ("Control of Electric Field Strength and Orientation at the Donor-Acceptor Interface in Organic Solar Cells"); Adv. Mater. 2008,20, 1065-1070.

Korean Office Action dated Mar. 10, 2015 issued in corresponding Korean Application No. 10-2013-0016972 (English translation provided).

Lee, et al. "Photoelectronic Device Including Organic Nanowire", News Information for Chemical Engineers, vol. 27, No. 2, No. 143, pp. 176-180 (2009) (partial English translation provided).

* cited by examiner

SOLAR CELL HAVING ORGANIC NANOWIRES

CROSS-REFERENCE TO RELATED APPLICATION

This U.S. non provisional patent application is a divisional of U.S. application Ser. No. 12/656,837, filed Feb. 17, 2010, claims priority under 35 U.S.C. §119 to Korean Patent Application No. 10-2009-0098412, filed on Oct. 15, 2009 with the Korean Intellectual Property Office, the entire disclosure of which is incorporated herein by reference.

BACKGROUND

1. Field

The present disclosure relates to solar cells, including solar cells with organic nanowires.

2. Description of the Related Art

Conventional silicon (Si) solar cells involve relatively high material costs, relatively expensive process equipment, and relatively high process costs. As a result, it has been difficult to reduce the manufacturing costs of conventional silicon solar cells. Also, it is relatively difficult to manufacture solar cells having larger areas, and substrates that may be used in manufacturing solar cells are rather limited. Organic solar cells may be conventionally formed by blending an n-type material formed of an inorganic material (e.g., fluorine) and a p-type material formed of an organic material. However, organic solar cells have a relatively low efficiency as a result of blending inorganic materials and organic materials. Thus, an additional annealing process is conventionally needed to manufacture organic solar cells.

SUMMARY

Example embodiments relate to solar cells including organic nanowires. A solar cell according to example embodiments may include a first electrode and a second electrode spaced apart from each other; and a photoelectric conversion layer between the first and second electrodes and configured to form p-n junctions, wherein the photoelectric conversion layer includes a p-type material and an n-type material, the p-type material including an organic material, and the n-type material including organic nanowires.

The n-type material may include perylene tetracarboxylic diimide (PTCDI) or a derivative thereof. The p-type material may include polythiophene (P3HT) or poly(phenylenevinylene) (PPV). The first and second electrodes may be a transparent electrode and a metal electrode, respectively.

The first and second electrodes may be a p-type electrode and an n-type electrode, respectively. In such a case, the solar cell may further include a hole transporting layer between the first electrode and the photoelectric conversion layer, and an electron transporting layer between the second electrode and the photoelectric conversion layer.

Alternatively, the first and second electrodes may be an n-type electrode and a p-type electrode, respectively. In such a case, the solar cell may further include a hole blocking layer between the first electrode and the photoelectric conversion layer, and a hole transporting layer between the second electrode and the photoelectric conversion layer.

Another solar cell according to example embodiments may include a first electrode and a second electrode spaced apart from each other; a p-type material layer including an organic material between the first and second electrodes; and an n-type material layer including aligned organic nanowires between the first and second electrodes, the n-type material layer forming p-n junctions with the p-type material layer. The first and second electrodes may be parallel to the organic nanowires and arranged under and on the organic nanowires, respectively. Alternatively, the first and second electrodes may be perpendicular to the organic nanowires and disposed on end portions of the organic nanowires.

Another solar cell according to example embodiments may include a first electrode and a second electrode spaced apart from each other; and a plurality of photoelectric conversion layers between the first and second electrodes and configured to form p-n junctions, wherein each of the plurality of photoelectric conversion layers includes an n-type material and a p-type material, the n-type material including aligned organic nanowires, and the p-type material surrounding the aligned organic nanowires.

BRIEF DESCRIPTION OF THE DRAWINGS

The above and/or other aspects of example embodiments may become more apparent and readily appreciated when the following description is taken in conjunction with the accompanying drawings of which.

DETAILED DESCRIPTION

Figure 1:
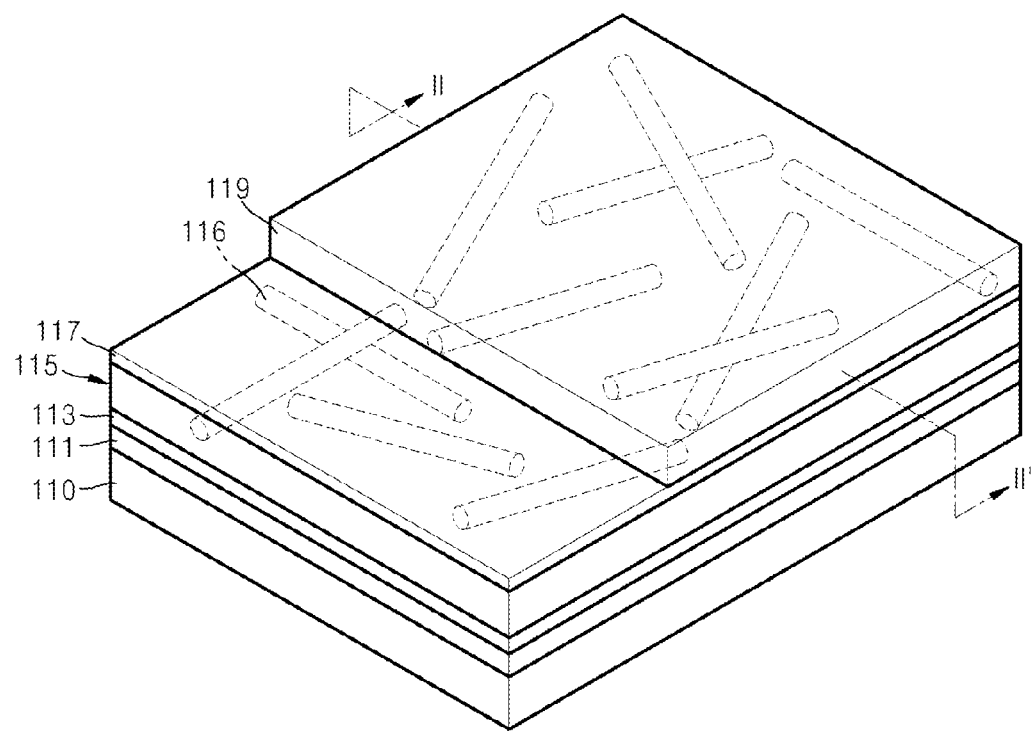
FIG. 1 is a perspective view illustrating a solar cell according to example embodiments.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
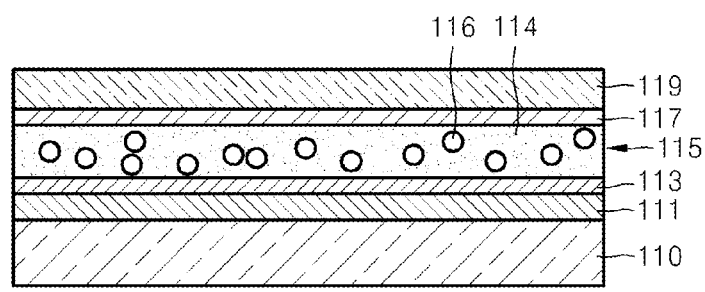
FIG. 2 is a cross-sectional view of the solar cell of FIG. 1 along line II-II'.

FIG. 1 is a perspective view illustrating a solar cell according to example embodiments. FIG. 2 is a cross-sectional view of the solar cell of FIG. 1 along line II-II'. Referring to FIGS. 1 and 2, the solar cell may include a first electrode 111 and a second electrode 119 that are separated apart from each other. A photoelectric conversion layer 115 may be disposed between the first electrode 111 and the second electrode 119 and configured to form p-n junctions. The first electrode 111 may be a p-type electrode and may be formed of, for example, a transparent conductive material (e.g., indium tin oxide (ITO)), although example embodiments are not limited thereto. The first electrode 111 may be formed on a substrate 110. The substrate 110 may be a transparent substrate formed of, for example, glass or plastic. However, the substrate 110 is not limited thereto and may be formed of other various materials.

A hole transporting layer (HTL) 113 may be further formed on the first electrode 111. Holes generated by the photoelectric conversion layer 115 may move to the first electrode 111, which may be a p-type electrode, with relative ease as a result of the HTL 113. The HTL 113 may be formed of, for example, poly(3,4-ethylene dioxythiophene):poly (styrene sulfate) (PEDOT:PSS), although example embodiments are not limited thereto.

The photoelectric conversion layer 115, which generates holes and electrons by absorbing light, may be formed on the HTL 113. The photoelectric conversion layer 115 may be formed of a p-type material 114 including an organic material and an n-type material 116 including organic nanowires. The organic nanowires may refer to organic materials shaped as nanowires. The p-type material 114 may be formed of, for example, polythiophene (P3HT), poly(phenylenevinylene) (PPV), or other various materials. Also, the n-type material 116 may include nanowires formed of, for example, perylene tetracarboxylic diimide (PTCDI) or any of the derivatives thereof, although example embodiments are not limited thereto. For example, the photoelectric conversion layer 115 may be formed of a composite in which the n-type material 116 including N,N-bis(2-phenylethyl)-perylene-3,4:9,10-tetracarboxylic diimide (BPE-PTCDI) nanowires are dispersed in the p-type material 114 including P3HT. The BPE-PTCDI nanowires may be randomly dispersed in the P3HT.

The photoelectric conversion layer 115 formed of a composite of BPE-PTCDI nanowires and P3HT may be formed in the following manner. The BPE-PTCDI may be mixed with P3HT in an o-dichlorobenzene (ODCB) solution. The mixed solution may be heated at a predetermined temperature, for example, 160° C., and gradually cooled. Accordingly, BPE-PTCDI nanowires may be formed by self-assembly. The BPE-PTCDI nanowires may have a diameter of about several tens of nm and a length of about several tens of μm. The mixture solution containing the BPE-PTCDI nanowires and the P3HT may be coated on the HTL 113, thereby forming the photoelectric conversion layer 115 formed of a composite of BPE-PTCDI and P3HT. The coating of the mixture solution may be performed by spin coating, spin casting, or doctor blading, although other suitable techniques may also be used.

An electron transporting layer (ETL) 117 may be further formed on the photoelectric conversion layer 115. Electrons generated by the photoelectric conversion layer 115 may move to the second electrode 119, which may be an n-type electrode, with relative ease as a result of the ETL 117. The ETL 117 may be formed of, for example, LiF or other various materials. The second electrode 119 is formed on the ETL 117. The second electrode 119 may be an n-type electrode, and may be formed of, for example, a metal (e.g., Al). However, the second electrode 119 is not limited thereto.

As described above, the photoelectric conversion layer 115 may be formed of a composite of the p-type material 114 formed of an organic material and the n-type material 116 formed of organic nanowires having desirable crystalline characteristics. Accordingly, charge movement characteristics and charge collecting characteristics may be improved, and the recombination of holes and electrons may be reduced, thereby increasing the efficiency of the solar cell. In addition, by manufacturing the solar cell using an organic material, manufacturing costs may be reduced, and also, relatively large-sized solar cells or flexible solar cells may be implemented.

Figure 3:
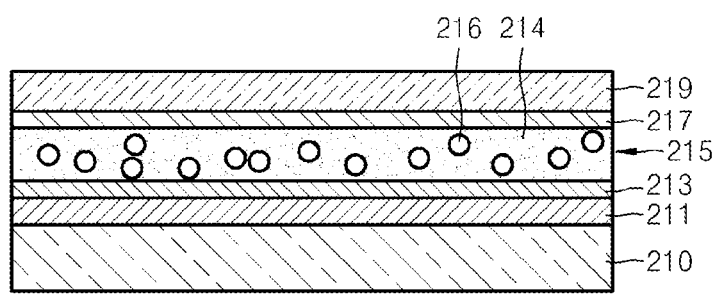
FIG. 3 is a cross-sectional view illustrating another solar cell according to example embodiments.

FIG. 3 is a cross-sectional view illustrating another solar cell according to example embodiments. It should be noted that the description of features corresponding to previously-discussed elements will not be repeated below for purposes of brevity. Rather, the descriptions hereinafter will focus on differences from the previous example(s).

Referring to FIG. 3, a first electrode 211 may be formed on a substrate 210. The first electrode 211 may be an n-type electrode formed of a transparent conductive material, e.g., fluorine-doped tin oxide (FTO). However, the first electrode 211 is not limited thereto. A hole blocking layer (HBL) 213 may be formed on the first electrode 211. The HBL 213 blocks holes generated by a photoelectric conversion layer 215 (which will be described later) from moving to the first electrodes 211, which may be an n-type electrode. The HBL 213 may be formed of, for example, $TiO_2$ or other various materials.

The photoelectric conversion layer 215 may be formed on the HBL 213. As described above, the photoelectric conversion layer 215 may be formed of a p-type material 214 including an organic material and an n-type material 216 including organic nanowires. The p-type material 214 may include, for example, P3HT or PPV. Also, the n-type material 216 may include, for example, nanowires formed of PTCDI or any of the derivatives thereof. However, the p-type material 214 and the n-type material 216 are not limited thereto.

An HTL 217 may be further formed on the photoelectric conversion layer 215. The HTL 217 may be formed of, for example, PEDOT:PSS or other various materials. A second electrode 219 may be formed on the HTL 217. The second electrode 219 may be a p-type electrode formed of a metal (e.g., Au). However, the second electrode 219 is not limited thereto.

Figure 4:
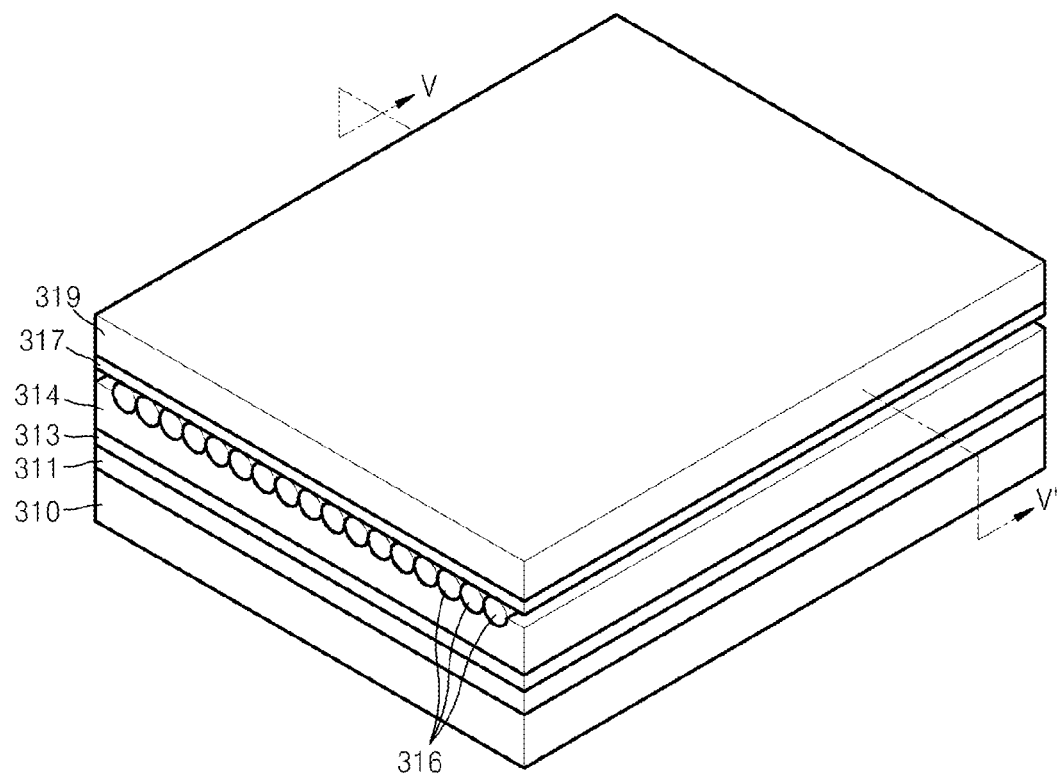
FIG. 4 is a perspective view illustrating another solar cell according to example embodiments.
Figure 5:
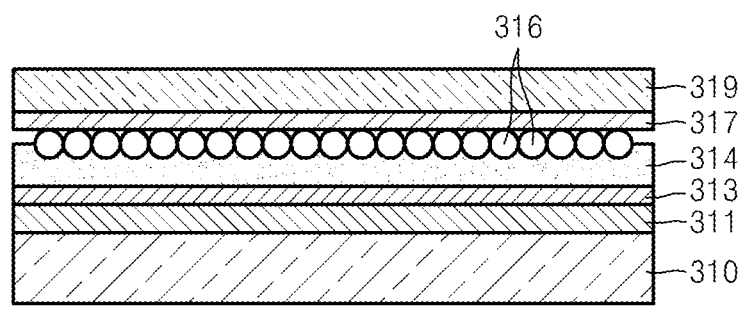
FIG. 5 is a cross-sectional view illustrating the solar cell of FIG. 4 along line V-V'.

FIG. 4 is a perspective view illustrating another solar cell according to example embodiments. FIG. 5 is a cross-sectional view illustrating the solar cell of FIG. 4 along line V-V'. Referring to FIGS. 4 and 5, the solar cell may include a first electrode 311 and a second electrode 319 that are separated apart from each other and a p-type material layer 314 and an n-type material layer 316 that are disposed between the first and second electrodes 311 and 319. The first electrode 311 may be a p-type electrode formed of a transparent conductive material (e.g., ITO). However, the first electrode 311 is not limited thereto. The first electrode 311 may be formed on a substrate 310. The substrate 310 may be a transparent substrate formed of, for example, glass or plastic. However, the substrate 310 is not limited thereto and may be formed of other various materials.

An HTL 313 may be formed on the first electrode 311. The HTL 313 may be formed of, for example, PEDOT:PSS or other various materials. The p-type material layer 314 formed of an organic material may be formed on the HTL 313. The p-type material layer 314 may be formed of, for example, P3HT, PPV, or other various materials. The n-type material layer 316 may be formed on the p-type material layer 314. The n-type material layer 316 and the p-type material layer 314 may form p-n junctions. The n-type material layer 316 may be formed of aligned organic nanowires. The organic nanowires may be aligned so as to be parallel to the first and second electrodes 311 and 319. Referring to FIG. 5, the organic nanowires are illustrated as being formed so as to contact one another. However, it should be understood that example embodiments are not limited thereto. For instance, the organic nanowires may be separated from one another by predetermined distances. The n-type material layer 316 may include, for example, nanowires formed of PTCDI or derivatives thereof (e.g., BPE-PIDCI). However, the n-type material layer 316 is not limited thereto.

The n-type material layer 316 formed of, for example, aligned BPE-PTCDI nanowires may be formed in the following manner. BPE-PTCDI may be mixed in an ODCB solution. The mixture solution may be heated at a predetermined temperature (e.g., 160° C.) and gradually cooled. Accordingly, BPE-PTCDI nanowires may be formed by self-assembly. The BPE-PTCDI nanowires may have a diameter of about several tens of nm and a length of about several tens of μm. In The BPE-PTCDI nanowires may be aligned using a filtration and transfer (FAT) process. The n-type material layer 316 may be formed by transferring the BPE-PTCDI nanowires onto the p-type material layer 314.

An electron transporting layer (ETL) 317 may be further formed on the n-type material layer 316. The ETL 317 may be formed of, for example, LiF or other various materials. The second electrode 319 is formed on the ETL 317. The second electrode 319 may be an n-type electrode and may be formed of, for example, a metal (e.g., Al). However, the second electrode 319 is not limited thereto.

As described above, the n-type material layer 316 formed of aligned organic nanowires may be formed on the p-type material layer 314 formed of an organic material. Accordingly, charges generated by light absorption may move with relative ease to the first and second electrodes 311 and 319 along the aligned organic nanowires separated at predetermined intervals, thereby further increasing the efficiency of the solar cell. In addition, because the solar cell is manufactured by using an organic material, the manufacturing costs thereof may be reduced and relatively large-sized solar cells or flexible solar cells may be implemented.

Figure 6:
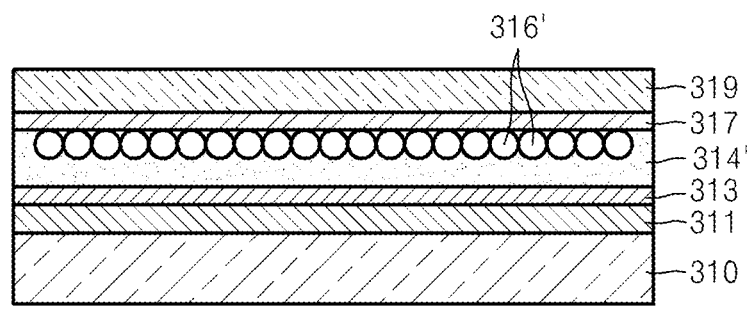
FIG. 6 is a cross-sectional view illustrating a variation of the solar cell of FIG. 5.

FIG. 6 is a cross-sectional view illustrating a variation of the solar cell of FIG. 5. Referring to FIG. 6, a p-type material layer 314' that is formed of an organic material and on an HTL 313 may be formed so as to cover an n-type material layer 316' that is formed of aligned organic nanowires and on a lower surface of an ETL 317. The p-type material layer 314' may be formed so as to contact an upper surface of the HTL 313 and the lower surface of the ETL 317.

Figure 7:
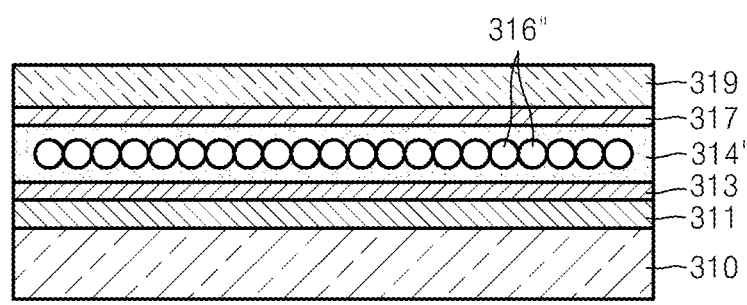
FIG. 7 is a cross-sectional view illustrating another variation of the solar cell of FIG. 5.

FIG. 7 is a cross-sectional view illustrating another variation of the solar cell of FIG. 5. Referring to FIG. 7, an n-type material layer 316" that is formed of aligned organic nanowires may be formed within a p-type material layer 314" that is formed of an organic material and on an HTL 313. The p-type material layer 314" is formed between the HTL 313 and an ETL 317, and the n-type material layer 316" may be formed so as to be buried within the p-type material layer 314".

Figure 8:
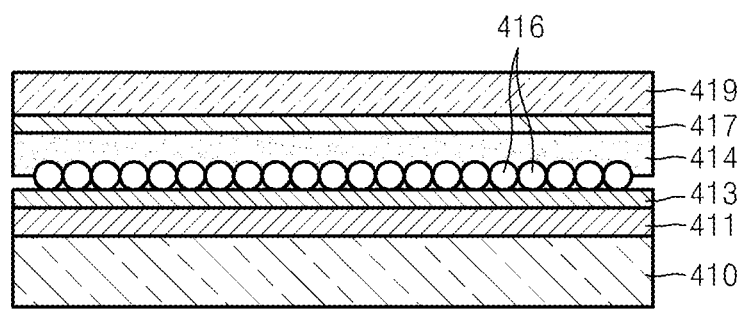
FIG. 8 is a cross-sectional view illustrating another solar cell according to example embodiments.

FIG. 8 is a cross-sectional view illustrating another solar cell according to example embodiments. It should be noted that the description of features corresponding to previously-discussed elements will not be repeated below for purposes of brevity. Rather, the descriptions hereinafter will focus on differences from the previous example(s).

Referring to FIG. 8, a first electrode 411 may be formed on a substrate 410. The first electrode 411 may be an n-type electrode formed of a transparent conductive material (e.g., FTO). However, the first electrode 411 is not limited thereto. A hole blocking layer (HBL) 413 may be formed on the first electrode 411. The HBL 413 may be formed of, for example, $TiO_2$ or other various materials.

An n-type material layer 416 is formed on the HBL 413. As described above, the n-type material layer 416 may be formed of aligned organic nanowires. The aligned organic nanowires may be aligned so as to be parallel to the first electrode 411 and a second electrode 419. The n-type material layer 416 may include, for example, nanowires formed of PTCDI or any suitable derivatives thereof. However, the n-type material layer 416 is not limited thereto.

A p-type material layer 414 is formed on the n-type material layer 416. The p-type material layer 414 and the n-type material layer 416 may form p-n junctions. The p-type material layer 414 may be formed of, for example, P3HT or PPV. Also, an HTL 417 may be further formed on the p-type material layer 414. For example, the HTL 417 may be formed of PEDOT:PSS or other various materials. The second electrode 419 is formed on the HTL 417. The second electrode 419 may be a p-type electrode and may be formed of a metal (e.g., Au). However, the second electrode 419 is not limited thereto. Also, as shown in FIG. 8, the p-type material layer 414 is illustrated as being formed so as to rest on the n-type material layer 416. However, it should be understood that, alternatively, the p-type material layer 414 may be formed to conformally cover the n-type material layer 416. For instance, the p-type material layer 414 may be formed so as to contact a lower surface of the HTL 417 and an upper surface of the HBL 413.

Figure 9:
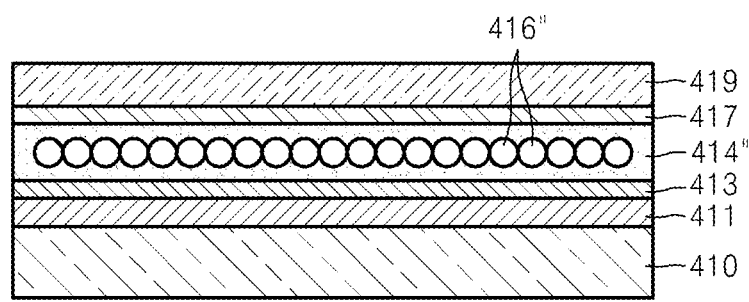
FIG. 9 is a cross-sectional view illustrating a variation of the solar cell of FIG. 8.

FIG. 9 is a cross-sectional view illustrating a variation of the solar cell of FIG. 8. Referring to FIG. 9, an n-type material layer 416" formed of aligned organic nanowires may be buried within a p-type material layer 414" formed of an organic material. The p-type material layer 414" may be disposed between an HTL 417 and an HBL 413.

Figure 10:
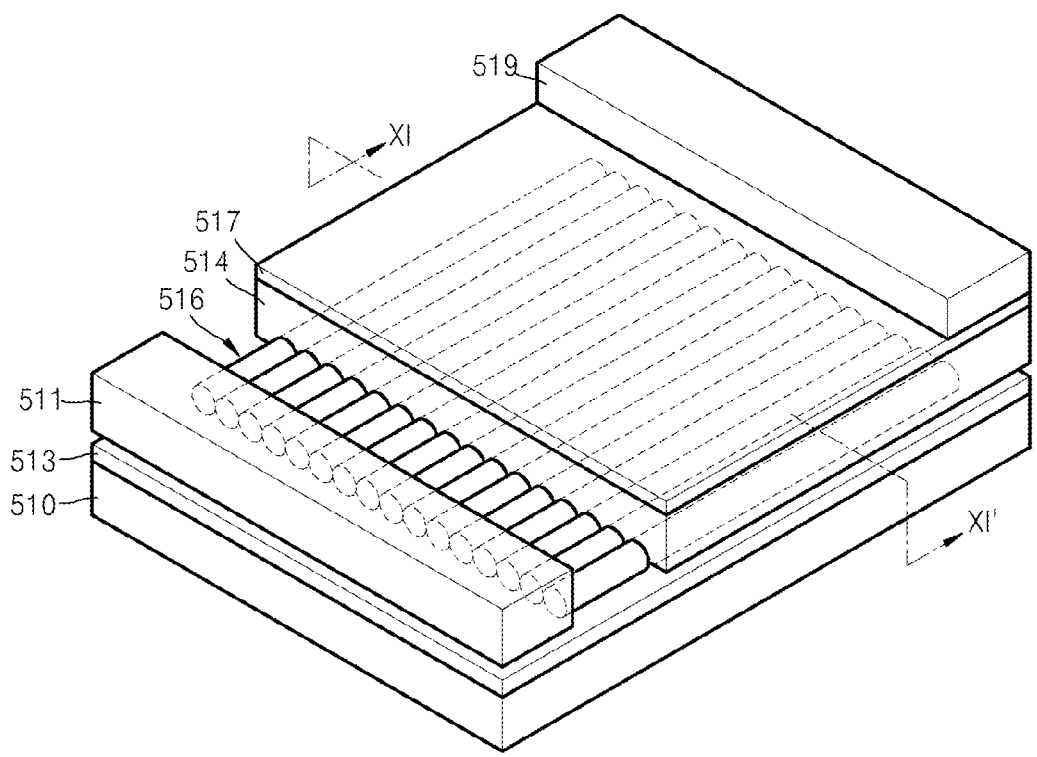
FIG. 10 is a perspective view illustrating another solar cell according to example embodiments.
Figure 11:
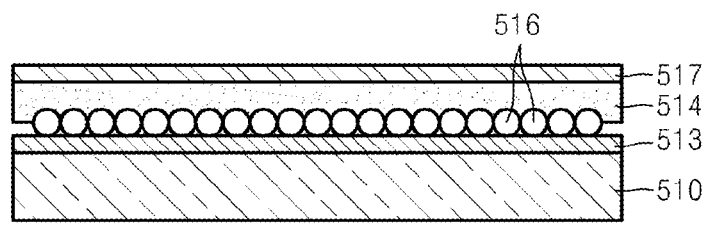
FIG. 11 is a cross-sectional view illustrating the solar cell of FIG. 10 along line XI-XI'.

FIG. 10 is a perspective view illustrating another solar cell according to example embodiments. FIG. 11 is a cross-sectional view illustrating the solar cell of FIG. 10 along line XI-XI'. Referring to FIGS. 10 and 11, the solar cell may include an n-type material layer 516 including aligned organic nanowires formed on a substrate 510, a p-type material layer 514 formed on the n-type material layer 516, and first and second electrodes 511 and 519 that are respectively formed at two ends of the n-type material layer 516 in a direction perpendicular to a direction in which the aligned organic nanowires extend. An ETL 513 may be further formed on the substrate 510. The substrate 510 may be a transparent substrate and may be formed of glass, plastic, or other suitable materials. However, the substrate 510 is not limited thereto and may be formed of other various materials. The ETL 513 may be formed of, for example, LiF or other various materials.

The n-type material layer 516 formed of aligned organic nanowires may be formed on the ETL 513. The organic nanowires may be aligned so as to be parallel to a surface of the substrate 510. In FIGS. 10 and 11, the organic nanowires of the n-type material layer 516 are illustrated as contacting one another. However, it should be understood that, alternatively, the organic nanowires may be separated from each other at predetermined intervals. The n-type material layer 516 may include nanowires formed of, for example, PTCDI or any suitable derivatives thereof (e.g., BPE-PTCDI). However, the n-type material layer 516 is not limited thereto.

The first electrode 511 may be formed on the ETL 513 so as to cover a first end portion of the aligned organic nanowires. The first electrode 511 may be formed in a direction perpendicular to a direction in which the aligned organic nanowires extend. The first electrode 511 may be an n-type electrode and may be formed of a transparent conductive material (e.g., FTO). However, the first electrode 511 is not limited thereto. Also, the p-type material layer 514 formed of an organic material may be formed on the n-type material layer 516. The p-type material layer 514 may be separated from the first electrode 511. Alternatively, the p-type material layer 514 may be formed on the ETL 513 so as to completely cover the n-type material layer 516 and/or may be formed so as to bury the n-type material layer 516. Also, although not shown in the drawing, an insulation layer may be further formed between the p-type material layer 514 and the first electrode 511, which may be an n-type electrode.

An HTL 517 may be further formed on the p-type material layer 514. The HTL 517 may be formed of, for example, PEDOT:PSS or other various materials. The second electrode 519 is formed on the HTL 517. The second electrode 519 may be disposed on a second end portion of the aligned organic nanowires of the n-type material layer 516. The second electrode 519 may be disposed in a direction perpendicular to a direction in which the aligned organic nanowires extend. The second electrode 519 may be a p-type electrode and may be formed of a metal (e.g., Au). However, the second electrode 519 is not limited thereto. As described above, the first and second electrodes 511 and 519 may be formed on two ends portions of the aligned organic nanowires of the n-type material layer 516 in a direction perpendicular to a direction in which the aligned organic nanowires extend.

Figure 12:
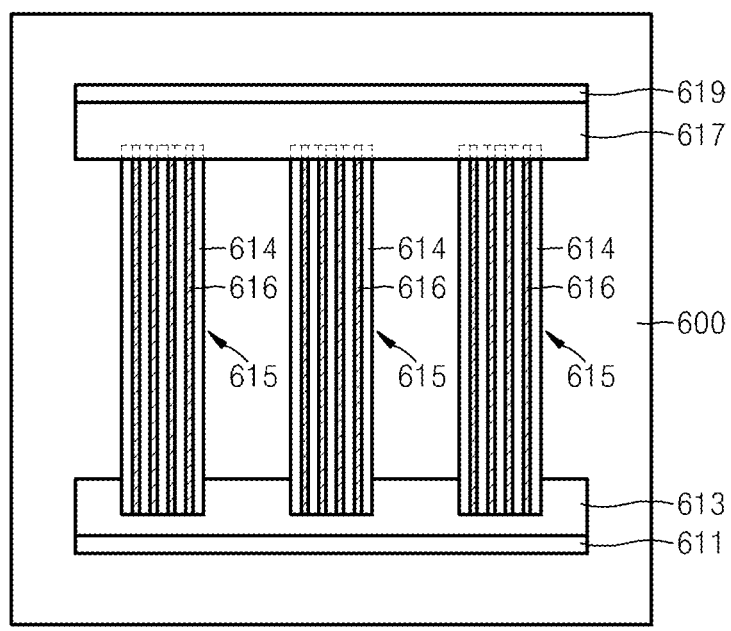
FIG. 12 is a plan view illustrating another solar cell according to example embodiments.

FIG. 12 is a plan view illustrating another solar cell according to example embodiments. Referring to FIG. 12, the solar cell may include a first electrode 611 and a second electrode 619 that are separated apart from each other, and a plurality of photoelectric conversion layers 615 that are formed between the first and second electrodes 611 and 619. The first and second electrodes 611 and 619 and the plurality of the photoelectric conversion layers 615 may be formed on a substrate 600. The substrate 600 may be a transparent substrate and may be formed of glass, plastic, or other suitable materials. However, the substrate 600 is not limited thereto.

The photoelectric conversion layers 615 may be formed of an n-type material 616 and a p-type material 614 surrounding the n-type material 616. The p-type material 614 may be formed of, for example, P3HT, PPV, or other various materials. The n-type material 616 may include, for example, nanowires formed of PTCDI or suitable derivatives thereof. However, the n-type material 616 is not limited thereto. The p-type material 614 may be formed so as to cover the n-type material 616. For instance, the p-type material 614 may be formed on the n-type material 616 or may be formed so as to bury the n-type material 616 therein. Organic nanowires of the n-type material 616 may be aligned in a direction perpendicular to the first and second electrodes 611 and 619. For example, the first and second electrodes 611 and 619 may be aligned in a direction perpendicular to a direction in which the organic nanowires extend and disposed on two end portions of the organic nanowires of the n-type material 616.

The first and second electrodes 611 and 619 may be a p-type electrode and an n-type electrode, respectively. An HTL 613 may be further disposed between the first electrode 611 and the photoelectric conversion layers 615. Also, an ETL 617 may be disposed between the second electrode 619 and the photoelectric conversion layers 615. Alternatively, the first and second electrodes 611 and 619 may be an n-type electrode and a p-type electrode, respectively. In such a case, an ETL (not shown) may be disposed between the first electrode 611 and the photoelectric conversion layers 615, and an HTL (not shown) may be disposed between the second electrode 619 and the photoelectric conversion layers 615. Referring to FIG. 12, the plurality of photoelectric conversion layers 615 may be arranged on a transparent substrate 600, thereby resulting in the manufacture of a relatively large-sized solar cell. In addition, a photo current generated by the solar cell may also be increased.

As described above according to example embodiments, the photoelectric conversion layers of a solar cell may be formed using a p-type material including an organic material and an n-type material including organic nanowires having desired crystalline characteristics, thereby improving the charge mobility and charge collecting characteristics, reducing recombination of holes and electrons, and increasing the efficiency of the solar cell. In addition, because the solar cell is manufactured using an organic material, the manufacturing costs thereof may be reduced, and relatively large-sized solar cells or flexible solar cells may be manufactured.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A solar cell comprising:
   a first electrode and a second electrode spaced apart from each other;
   a p-type material layer including an organic material between the first and second electrodes; and
   an n-type material layer including aligned organic nanowires between the first and second electrodes, the n-type material layer forming p-n junctions with the p-type material layer,
   wherein the first and second electrodes are formed on end portions of the aligned organic nanowires in a direction perpendicular to a direction in which the aligned organic nanowires extend,
   wherein the first electrode directly contacts the n-type material layer and is spaced apart from the p-type material layer, and
   wherein the p-type material layer covers the n-type material layer.

2. The solar cell of claim 1, wherein the n-type material layer includes perylene tetracarboxylic diimide (PTCDI) or a derivative thereof.

3. The solar cell of claim 1, wherein the p-type material includes polythiophene (P3HT) or poly(phenylenevinylene) (PPV).

4. The solar cell of claim 1, wherein the first and second electrodes are a transparent electrode and a metal electrode, respectively.

5. The solar cell of claim 1, wherein the first and second electrodes are an n-type electrode and a p-type electrode, respectively.

6. The solar cell of claim 5, further comprising:
   a hole transporting layer between the first electrode and the p-type material layer; and
   an electron transporting layer below the n-type material layer.

* * * * *